(12) United States Patent
Matsumoto et al.

(10) Patent No.: US 10,211,250 B2
(45) Date of Patent: Feb. 19, 2019

(54) SOLID-STATE IMAGE SENSOR ELECTRONIC DEVICE

(71) Applicant: SONY SEMICONDUCTOR SOLUTIONS CORPORATION, Kanagawa (JP)

(72) Inventors: Ryosuke Matsumoto, Tokyo (JP); Masahiro Joei, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/319,903

(22) PCT Filed: Jun. 23, 2015

(86) PCT No.: PCT/JP2015/067981
§ 371 (c)(1),
(2) Date: Dec. 19, 2016

(87) PCT Pub. No.: WO2016/002576
PCT Pub. Date: Jan. 7, 2016

(65) Prior Publication Data
US 2017/0148841 A1    May 25, 2017

(30) Foreign Application Priority Data

Jul. 3, 2014   (JP) ................................ 2014-137438

(51) Int. Cl.
*H01L 27/146*   (2006.01)
*H01L 21/3205*  (2006.01)
(Continued)

(52) U.S. Cl.
CPC .... *H01L 27/14647* (2013.01); *H01L 21/3205* (2013.01); *H01L 21/768* (2013.01);
(Continued)

(58) Field of Classification Search
CPC .......... H01L 27/14647; H01L 27/1463; H01L 27/14636; H01L 27/14641;
(Continued)

(56) References Cited

U.S. PATENT DOCUMENTS 5,434,686 A * 7/1995 Kanemori ........... G02F 1/13624
                                                     345/93
6,353,228 B1 * 3/2002 Itabashi ............ H01L 27/14658
                                                     250/370.11
(Continued)

FOREIGN PATENT DOCUMENTS

| JP | 2006-245284 A | 9/2006 |
| JP | 2009-65160 A | 3/2009 |
| JP | 2012-533168 A | 12/2012 |
| JP | 2013-135122 A | 7/2013 |
| WO | WO 2014/103240 A1 | 7/2014 |

OTHER PUBLICATIONS

International Search Report prepared by the Japan Patent Office dated Aug. 13, 2015, for International Application No. PCT/JP2015/067981.

*Primary Examiner* — Kenneth Parker
*Assistant Examiner* — John Lin
(74) *Attorney, Agent, or Firm* — Sheridan Ross P.C.

(57) ABSTRACT

The present disclosure relates to a solid-state image sensor and an electronic device enabling prevention of entrance of incident light from adjacent pixels and suppression of color mixture, decrease in resolution, and decrease in sensitivity. In a solid-state image sensor according to one aspect of the present disclosure, each pixel includes: these different photoelectric conversion parts configured to perform photoelectric conversion of light of a first wavelength of light of a second wavelength and a third wavelength respectively. An electrode wiring provided at a boundary of adjacent pixels, horizontally connects an electrode of at least one of the photoelectric conversion parts in one of the adjacent pixels with an electrode of the corresponding one of the photo- (Continued)

electric conversion parts in another of the adjacent pixels and vertically connects with an electrode of at least one of the photoelectric conversion parts of each of the pixels.

18 Claims, 12 Drawing Sheets

(51) Int. Cl.
    *H01L 21/768*     (2006.01)
    *H04N 5/374*     (2011.01)

(52) U.S. Cl.
    CPC .... *H01L 27/1464* (2013.01); *H01L 27/14623* (2013.01); *H01L 27/14629* (2013.01); *H01L 27/14636* (2013.01); *H04N 5/374* (2013.01); *H01L 2924/0002* (2013.01)

(58) Field of Classification Search
    CPC ......... H01L 27/14665; H01L 27/14667; H01L 27/14655; H01L 27/14638
    See application file for complete search history.

(56) References Cited

U.S. PATENT DOCUMENTS

| | | | |
|---|---|---|---|
| 2005/0263839 A1* | 12/2005 | Suzuki | H01L 27/14636 257/430 |
| 2006/0181629 A1* | 8/2006 | Miyashita | H01L 27/14623 348/311 |
| 2014/0306276 A1* | 10/2014 | Yamaguchi | H01L 27/1464 257/292 |

* cited by examiner

SOLID-STATE IMAGE SENSOR ELECTRONIC DEVICE

CROSS REFERENCE TO RELATED APPLICATIONS

This application is a national stage application under 35 U.S.C. 371 and claims the benefit of PCT Application No, PCT/JP2015/067981 having an international filing date of Jun. 23, 2015, which designated the United States, Which PCT application claimed the benefit of Japanese Patent Application No. 2014-127438 filed Jul. 3, 2014, the disclosures of which are incorporated herein by reference in their entirety.

TECHNICAL FIELD

The present disclosure relates to a solid-state image sensor and an electronic device, and more particularly to a solid-state image sensor and an electronic device capable of obtaining an R-component signal, a G-component signal, and a B-component signal based on respective wavelengths of three primary colors R, G, and B in one pixel.

BACKGROUND ART

In related art, the size of pixels of solid-state image sensors typified by CMOS image sensors tends to be reduced for the purpose of increasing the number of pixels or the like, and in this case, there are problems of decrease in sensitivity and decrease in S/N due to reduction in the number of photons incident on the pixels.

In addition, in many solid-state image sensors, the top surface of each pixel is covered with a color filter of R, G, or B, and, for example, in a pixel covered with an R color filter (hereinafter referred to as an R pixel; this also applies to a G pixel and a B pixel), only the R component of incident light is used for photoelectric conversion while the G and B components of incident light are not used for photoelectric conversion, which causes a loss in sensitivity correspondingly. Furthermore, since an R pixel can generate an R-component signal but cannot generate a G-component signal and a B-component for example, the G-component and B-component signals are interpolated with use of outputs from a G pixel or a B pixel in the vicinity, which can cause false colors.

Thus, as a measure to solve these problems, a solid-state image sensor having three photoelectric conversion layers, which correspond to the respective wavelengths of R, G, and B in one pixel, stacked vertically, and being thus capable of generating an R-component signal, a G-component signal, and a B-component signal in one pixel is proposed (refer, for example, to Patent Document 1).

CITATION LIST

Patent Documents

Patent Document 1: Japanese Patent Application Laid-Open No. 2003-332551
Patent Document 2: Japanese Patent Application Laid-Open No. 2005-340571

SUMMARY OF THE INVENTION

Problems to be Solved by the Invention

Since separation of adjacent pixels is not taken into consideration in the configuration in which three photoelectric conversion layers corresponding to the respective wavelengths of R, G, and B are stacked vertically as described above, obliquely incident light may get into an adjacent pixel, which can cause color mixture, decrease in resolution, and decrease in sensitivity.

The present disclosure is made in view of these circumstances, and enables prevention of entrance of incident light from adjacent pixels and suppression of color mixture, decrease in resolution, and decrease in sensitivity.

Solutions to Problems

A solid-state image sensor according to a first aspect of the present disclosure is a solid-state image sensor having a plurality of pixels arranged in a matrix, wherein each of the pixels includes: a first photoelectric conversion part configured to perform photoelectric conversion on the basis of incident light of a first wavelength of three primary colors of light; a second photoelectric conversion part configured to perform photoelectric conversion on the basis of incident light of a second wavelength of the three primary colors of light; and a third photoelectric conversion part configured to perform photoelectric conversion on the basis of incident light of a third wavelength of the three primary colors of light, and the solid-state image sensor includes an electrode wiring at a boundary of adjacent pixels, the electrode wiring horizontally connecting an electrode of at least one of the first to third photoelectric conversion parts in one of the adjacent pixels with an electrode of the corresponding one of the first to third photoelectric conversion parts an another of the adjacent pixels and vertically connecting with an electrode of at least one of the first to third photoelectric conversion parts of each of the pixels.

At least one of the first to third photoelectric conversion parts can include a photoelectric conversion film, and a lower electrode and an upper electrode on respective sides of the photoelectric conversion and the electrode wiring can horizontally connect the upper electrode of at least one of the first to third photoelectric conversion parts in one of the adjacent pixels with the upper electrode of the corresponding one of the first to third photoelectric conversion parts in another of the adjacent pixels.

The electrode wiring can horizontally connect the upper electrodes of the first to third photoelectric conversion parts in one of the adjacent pixels with the upper electrodes of the first to third photoelectric conversion parts in another of the adjacent pixels, respectively.

The electrode wiring can vertically connect the upper electrodes of the first to third photoelectric conversion parts in each of the pixels.

At least one of the first to third photoelectric conversion parts can be a photoelectric conversion layer formed inside of a Si layer.

The solid-state image sensor according to the first aspect of the present disclosure can further include a reflective film layer that reflects incident light at a lower side of the first to third photoelectric conversion parts.

The electrode wiring can block light toward an Optical Black area.

The electrode wiring can be made of a metal material.

The solid-state image sensor can be of a backside-illuminated type.

The solid-state image sensor can be of a front-side-illuminated type.

The solid-state image sensor can be of a multiple-pixel-shared type.

The solid-state image sensor can be of a stacked type.

An electronic device according to a second aspect of the present disclosure is an electronic device including a solid-state image sensor having a plurality of pixels arranged in a matrix, wherein each of the pixels includes: a first photoelectric conversion part configured to perform photoelectric conversion on the basis of incident light of a first wavelength of three primary colors of light; a second photoelectric conversion part configured to perform photoelectric conversion on the basis of incident light of a second wavelength of the three primary colors of light; and a third photoelectric conversion part configured to perform photoelectric conversion on the basis of incident light of a third wavelength of the three primary colors of light, the solid-state image sensor including an electrode wiring at a boundary of adjacent pixels, the electrode wiring horizontally connecting an electrode of at least one of the first to third photoelectric conversion parts in one of the adjacent pixels with an electrode of the corresponding one of the first to third photoelectric conversion parts in another of the adjacent pixels and vertically connecting with an electrode of at least one of the first to third photoelectric conversion parts of each of the pixels.

Effects of the Invention

According to the first and second aspects of the present disclosure, entrance of incident light from adjacent pixels is prevented.

MODE FOR CARRYING CUT THE INVENTION

Preferred mode (hereinafter referred to as an embodiment) for carrying out the present disclosure will be described in detail below with reference to the drawings.

<Example Configuration of Solid-state Image Sensor of Present Embodiment>

Figure 1:
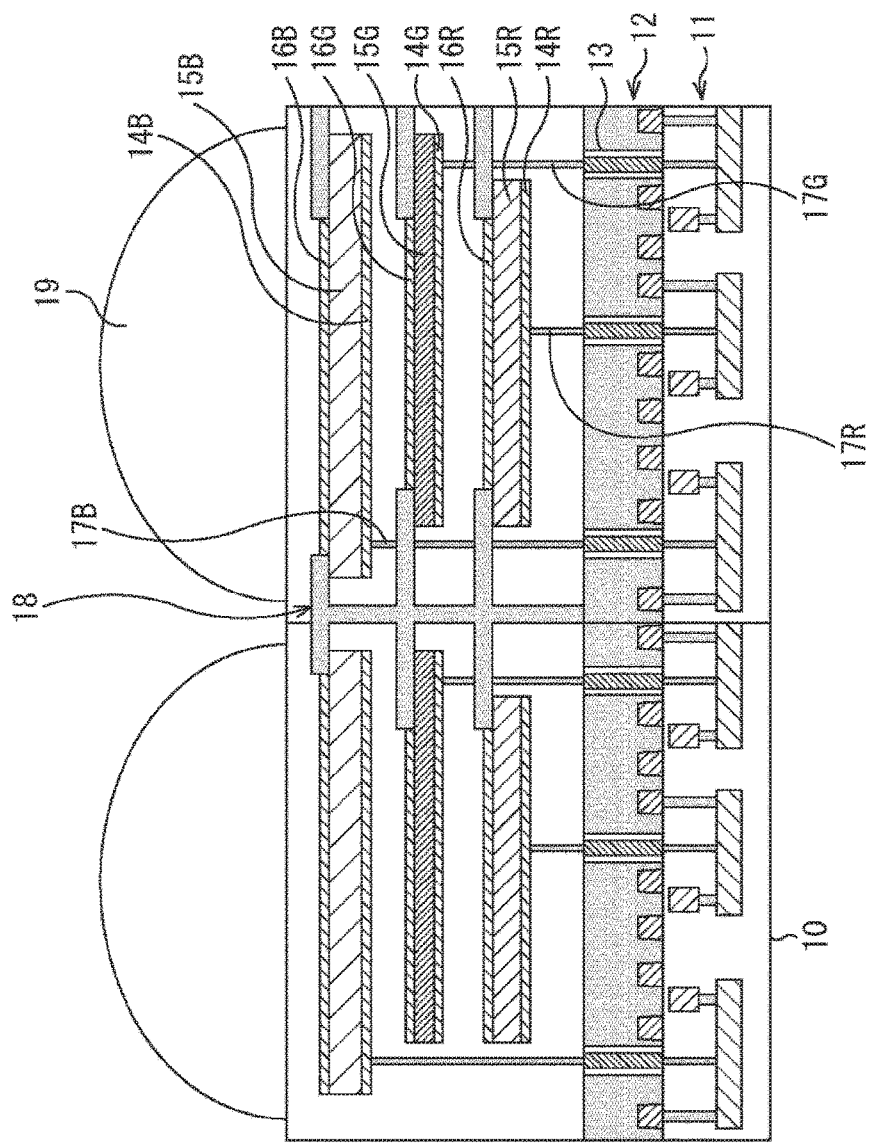
FIG. 1 is a cross-sectional view of a solid-state image sensor to which the present disclosure is applied.
Figure 2:
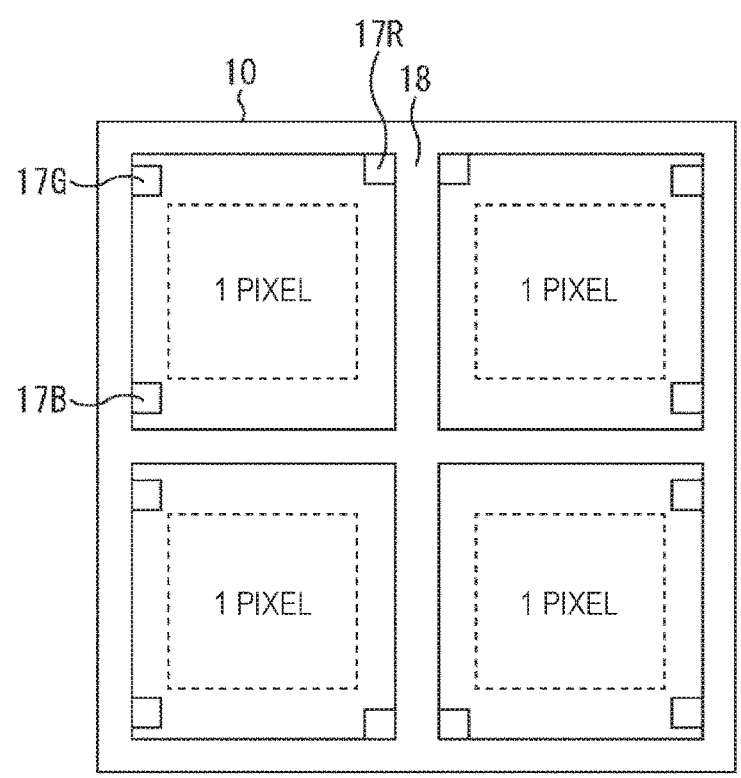
FIG. 2 is a top view of the solid-state image sensor to which the present disclosure is applied.

FIG. 1 is a cross-sectional view of two pixels of a solid-state image sensor of an embodiment of the present disclosure. FIG. 2 is a top view of four pixels of the solid-state image sensor.

As illustrated in FIG. 1, the solid-state image sensor 10 includes a wiring layer 11, a Si layer 12, a photoelectric conversion film 15R, a photoelectric conversion film 15G, a photoelectric conversion film 15B, and an on-chip lens 19, which are stacked in this order from the bottom on a not-illustrated Si substrate. A power supply 13, a floating diffusion, and the like are formed in the Si layer 12. Insulating layers made of SiN or the like are formed between the photoelectric conversion film 15R, the photoelectric conversion film 15G, and the photoelectric conversion film 15B.

The photoelectric conversion film 15R generates an R-component signal through photoelectric conversion depending on the R component of incident light, and a lower electrode 14R is formed on a lower surface while an upper electrode 16R is formed on an upper surface of the photoelectric conversion film 15R. The lower electrode 14R is connected to the power supply 13 via a lower electrode wiring 17R. The upper electrode 16R is connected to the Si layer 12 via an upper electrode wiring 18.

Similarly, the photoelectric conversion film 15G generates a G-component signal through photoelectric conversion depending on the G component of incident light, and a lower electrode 14G is formed on a lower surface while an upper electrode 16G formed on an upper surface of the photoelectric conversion film 15G. The lower electrode 14G is connected to the power supply 13 via a lower electrode wiring 17G. The upper electrode 16G is connected to the Si layer 12 via the upper electrode wiring 18.

The photoelectric conversion film 15B generates a B-component signal through photoelectric conversion depending on the B component of incident light, and a lower electrode 14B is formed on a lower surface while an upper electrode 16B is formed on an upper surface of the photoelectric conversion film 15B. The lower electrode 14B is connected to the power supply 13 via a lower electrode wiring 17B. The upper electrode 16B is connected to the Si layer 12 via the upper electrode wiring 18.

The upper electrode wiring 18 is made of a metal material, and disposed at a boundary of adjacent pixels as illustrated in FIGS. 1 and 2. The upper electrode wiring 18 connects the upper electrodes 16R, 16G, and 16B with the Si layer 12 as described above, and also provides connections between the upper electrodes 16R, between the upper electrodes 16G, and between the upper electrodes 16B of adjacent pixels.

The upper electrode wiring 18 thus formed functions as a light blocking wall around each pixel, collects light toward each pixel to be incident on the pixel, and suppresses leakage of light incident on each pixel to adjacent pixels. The upper electrode wiring 18 also functions as a light blocking layer between the photoelectric conversion films 15R, 15B, and 15B. Thus, in the solid-state image sensor 10, color mixture due to entrance of incident light from adjacent pixels, decrease in resolution, and decrease in sensitivity are suppressed.

<Method for Manufacturing Solid-state Image Sensor 10>

Figure 3:
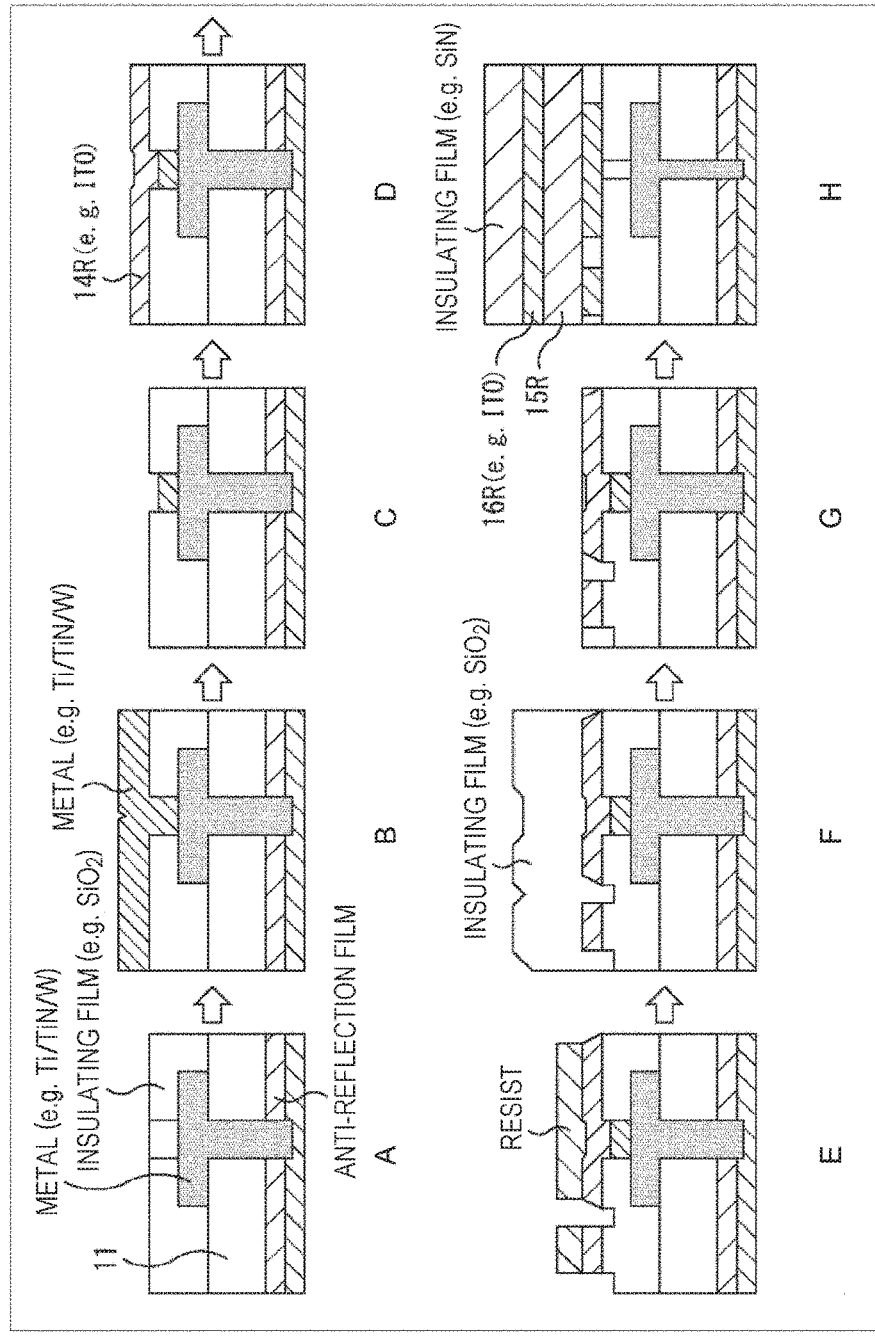
FIG. 3 is a diagram for explaining processes for manufacturing a solid-state image sensor to which the present disclosure is applied.
Figure 4:
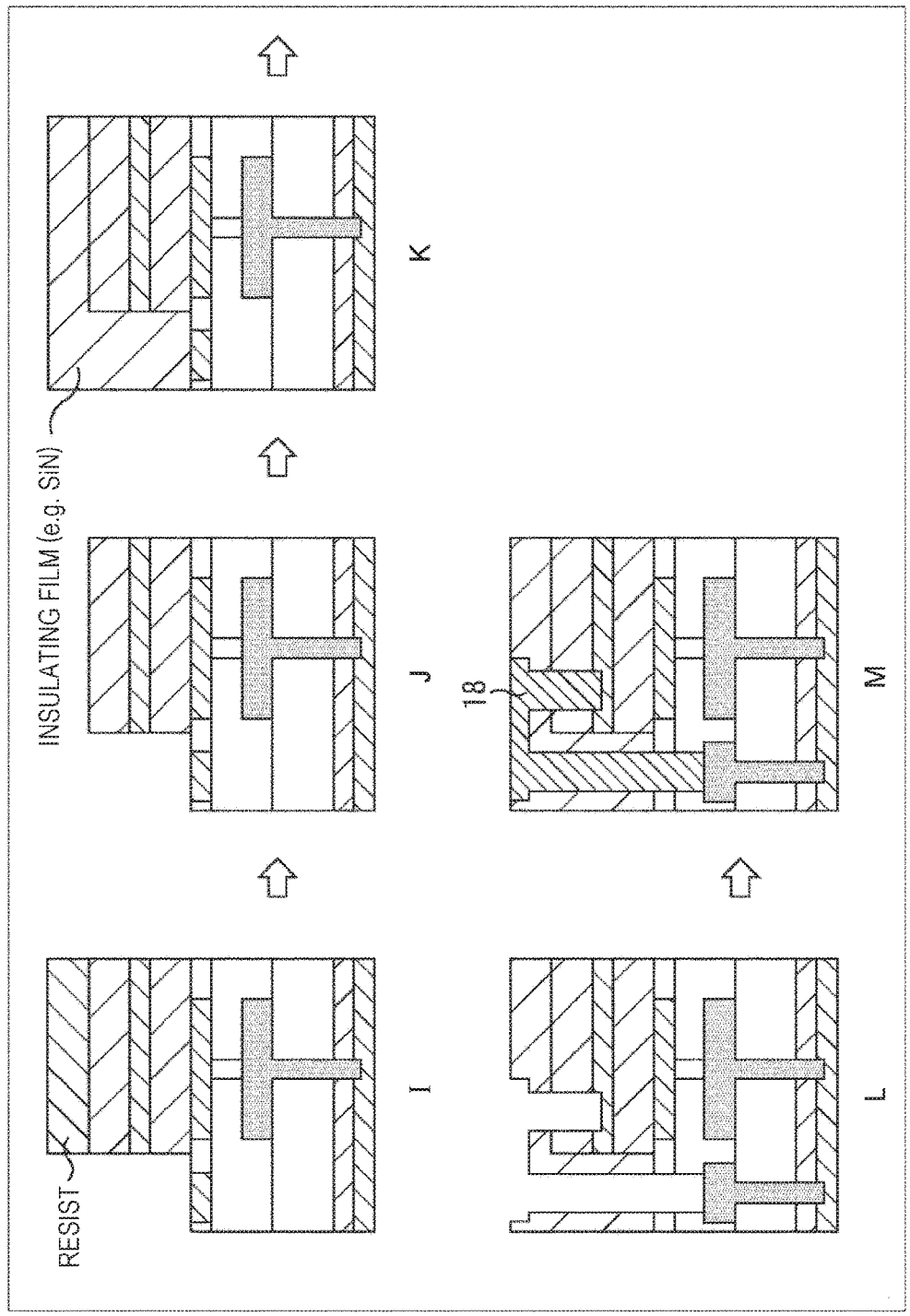
FIG. 4 is a diagram for explaining processes for manufacturing the solid-state image sensor to which the present disclosure is applied.

Next, FIGS. 3 and 4 are cross-sectional views illustrating processes relating to one layer (the lower electrode 14R, the photoelectric conversion film 15R, and the upper electrode 16R) corresponding to the R component of incident light among the processes for manufacturing the solid-state image sensor 10. These processes are repeated three times, so that the solid-state image sensor 10 is produced.

First, as illustrated in A to C of FIG. 3, after forming a necessary structure in a Si substrate (not-illustrated) that is a base, the wiring layer 11 is formed on the Si substrate, and a $SO_2$ film to be an insulating film is formed on the wiring layer 11. Subsequently, the insulating film is patterned by lithography, the wiring layer 11 is processed by dry etching or the like, and metal such as Ti, TiN, W, or Cu to be the lower electrode wiring 17R is embedded.

Subsequently, as illustrated in D to G of FIG. 3, an ITO film, for example, to be the lower electrode 14R is formed, a resist is formed on the ITO film, the ITO film is then patterned by lithography and processed by dry etching or the like, an insulating film is formed thereon, and the ITO film is then flattened by the CMP technique or the like.

Subsequently, as illustrated in H of FIG. 3, an organic film to be the photoelectric conversion film 15R, the upper electrode 16R made of ITO or the like, and an insulating film made of SiN or the like are formed.

Furthermore, as illustrated in I to K of FIG. 4, a resist is formed on the insulating film, the films are patterned by lithography, processed by dry etching or the like, and an insulating film made of SiN or the like is formed thereon. Still further, as illustrated in L and M of FIG. 4, a portion to be the upper electrode wiring 18 is patterned by lithography, and processed by dry etching or the like, and metal such as Cu is embedded as the upper electrode wiring 18.

The processes explained above are repeated twice more, and the solid-state image sensor 10 having three stacked photoelectric conversion layers can be produced.

<Another Example Configuration of Solid-state Image Sensor of Present Embodiment>

Figure 5:
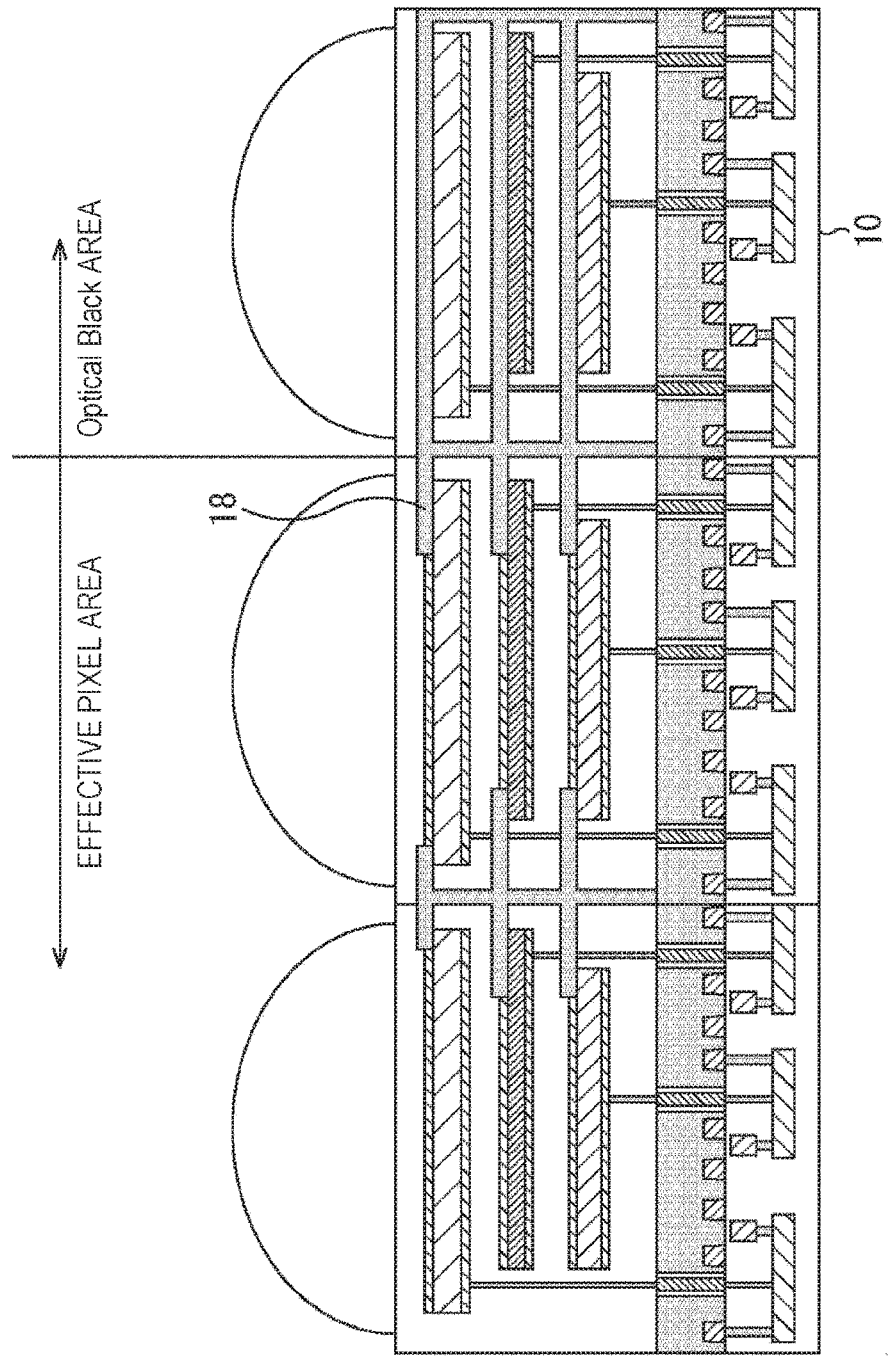
FIG. 5 is a cross-sectional view illustrating a modification 1 of the solid-state image sensor to which the present disclosure is applied.

FIG. 5 illustrates another example configuration (modification 1) of the solid-state image sensor 10 of the embodiment of the present disclosure.

The modification 1 is formed so that parts of the upper electrode wiring 18 connected with the upper electrodes 16R, 16G, and 16B in a pixel located in an Optical Black area provided at an end of the solid-state image sensor 10 are extended in the horizontal direct on to block light toward photoelectric conversion areas 15R, 15G, and 15B of the pixel. This enables prevention of entrance of light into the photoelectric conversion areas 15R, 15G, and 15B of the pixel. In other words, the upper electrode wiring 18 can be made to also function to block light toward the Optical Black area.

Figure 6:
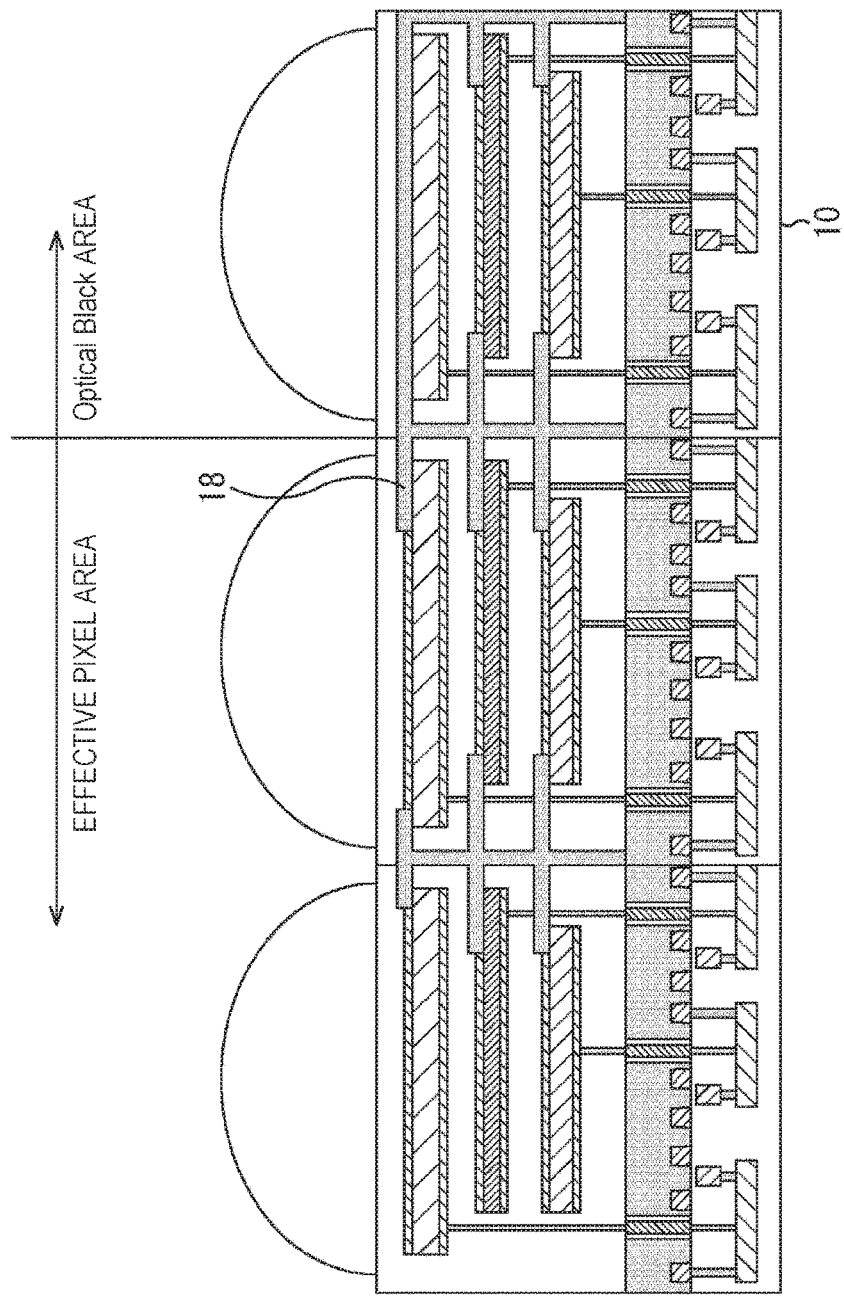
FIG. 6 is a cross-sectional view illustrating a modification 1-2 of the solid-state image sensor to which the present disclosure is applied.

FIG. 6 illustrates an example configuration (modification 1-2), which is a further modification of the modification 1 illustrated in FIG. 5.

The modification 1-2 is formed so that only a part of the upper electrode wiring 18 connected with the upper electrode 16B in a pixel located in the Optical Black area provided at the end of the solid-state image sensor 10 is extended in the horizontal direction to cover the entire photoelectric conversion area 15R of the pixel. Since this enables entrance of light into not only the photoelectric conversion area 15R but also the photoelectric conversion areas 15G and 15B of the pixel, parts of the upper electrode wiring 18 connected with the upper electrode 16R and 16G is not extended in the horizontal direction.

Figure 7:
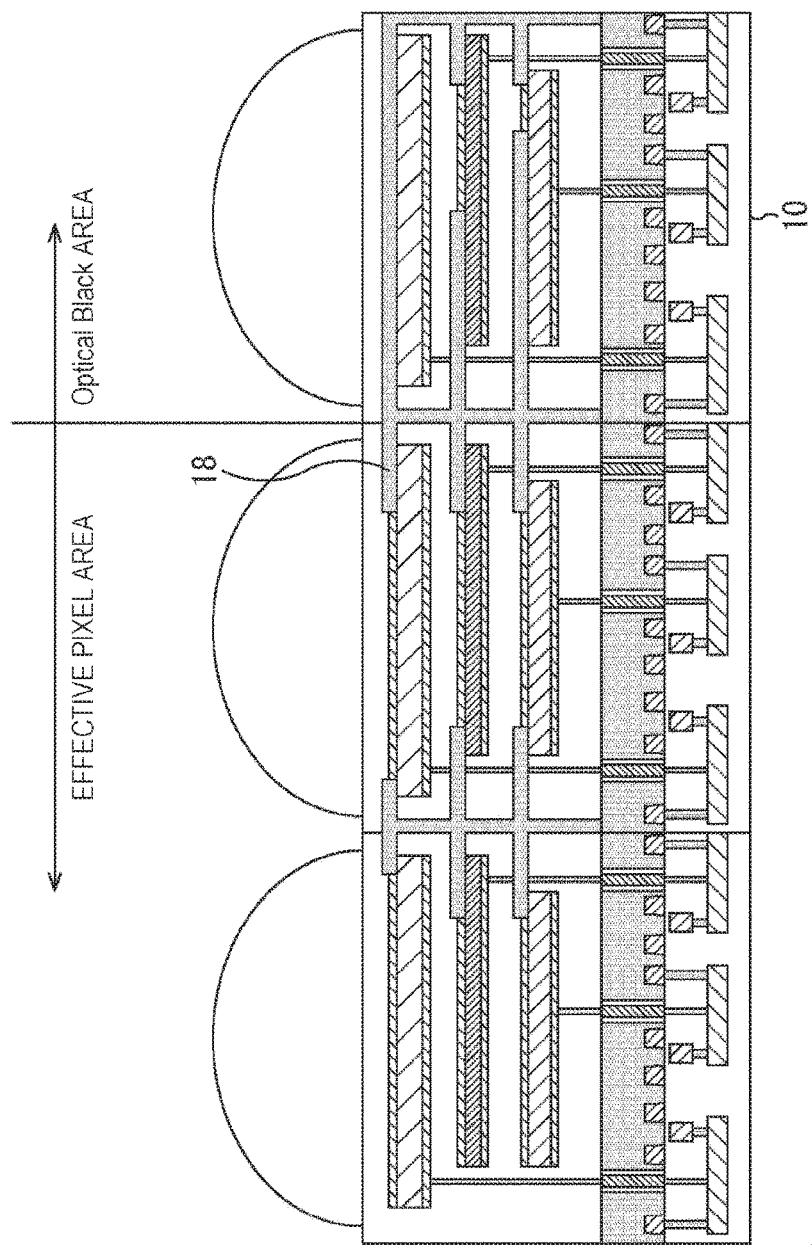
FIG. 7 is a cross-sectional view illustrating a modification 1-3 of the solid-state image sensor to which the present disclosure is applied.

FIG. 7 illustrates an example configuration (modification 1-3), which is a still further modification of the modification 1 illustrated in FIG. 5.

The modification 1-2 is formed so that a part of the upper electrode wiring 18 connected with the upper electrode 16B in a pixel located in the Optical Black area provided at the end of the solid-state image sensor 10 is extended in the horizontal direction to cover the entire photoelectric conversion area 15R of the pixel, and that parts of the upper electrode wiring 18 connected with the upper electrode 16G and 16R partially cover the photoelectric conversion areas 15G and 15R of the pixel. This enables prevention of entrance of light into the photoelectric conversion area 15R of the pixel. In addition, appropriate adjustment of the area by which the upper electrode wiring 18 covers the photoelectric conversion area 15G and 15R allows adjustment of dark current in the Optical Black area.

Figure 8:
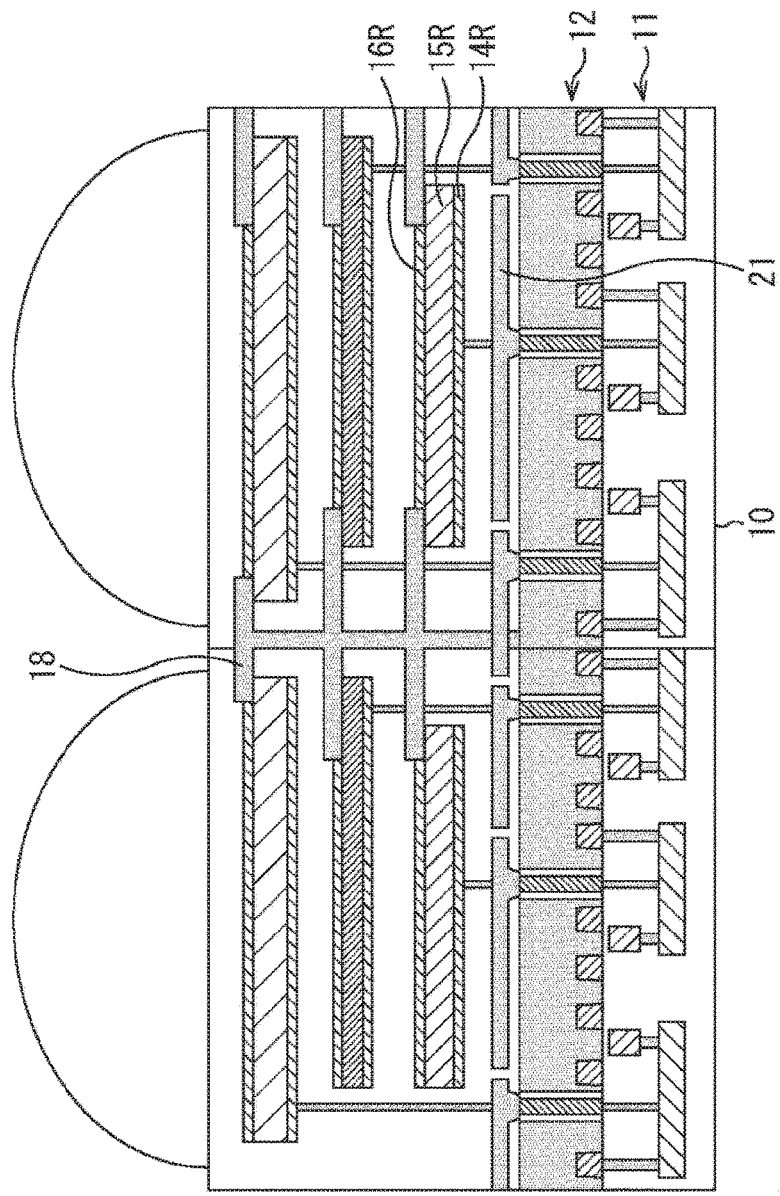
FIG. 8 is a cross-sectional view illustrating a modification 2 of the solid-state image sensor to which the present disclosure is applied.

FIG. 8 illustrates still another example configuration (modification 2) of the solid-state image sensor 10 of the embodiment of the present disclosure.

In the modification 2, a highly-reflective film layer 21 is additionally formed between the Si layer 12 and the lower electrode 14R, as compared with the example configuration of FIG. 1. Note that the highly-reflective film layer 21 may also function as the lower electrode wirings 17R, 17G, and 17B. Addition of the highly-reflective film layer 21 allows reflection of incident light upward, which increases the sensitivity.

Figure 9:
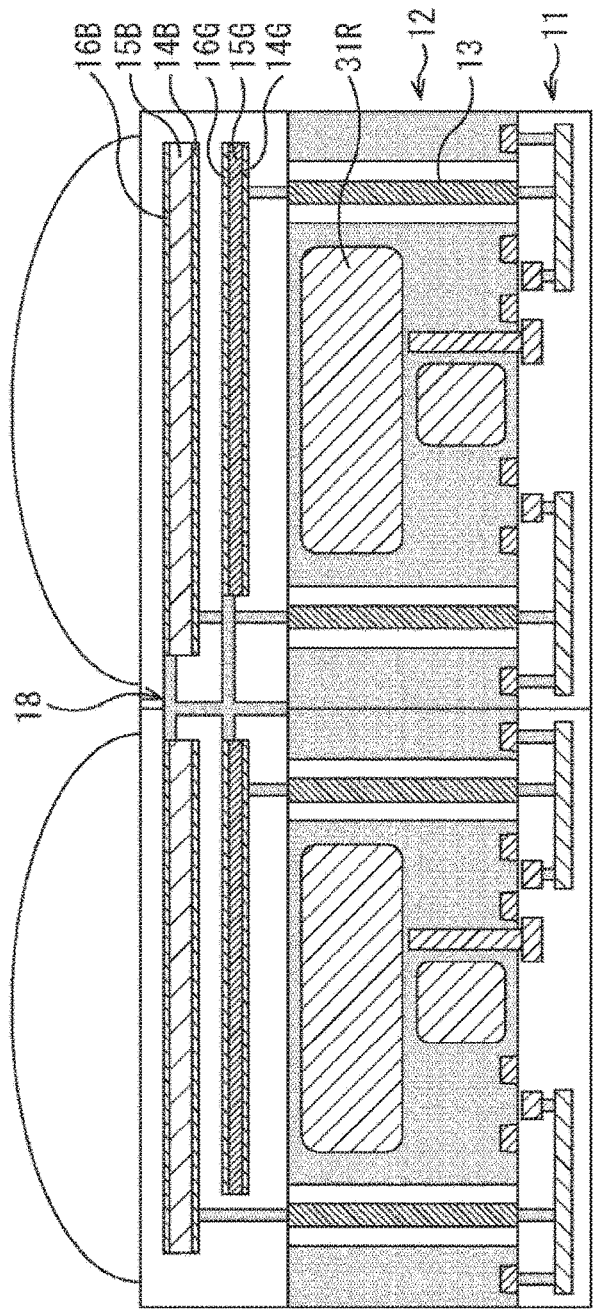
FIG. 9 is a cross-sectional view illustrating a modification 3 of the solid-state image sensor to which the present disclosure is applied.

FIG. 9 illustrates still another example configuration (modification 3) of the solid-state image sensor 10 of the embodiment of the present disclosure.

In the modification 3, a photoelectric conversion layer 31R that generates an R-component signal depending on the R component of incident light is provided inside of the Si layer 12, instead of the photoelectric conversion film 15R in the example configuration of FIG. 1. Alternatively, a photoelectric conversion layer that generates a G-component signal depending on the R component of incident light may be provided inside of the Si layer 12, instead of the photoelectric conversion film 15G, or a photoelectric conversion layer that generates a B-component signal depending on the B component of incident light may be provided inside of the Si layer 12, instead of the photoelectric conversion film 15B.

Figure 10:
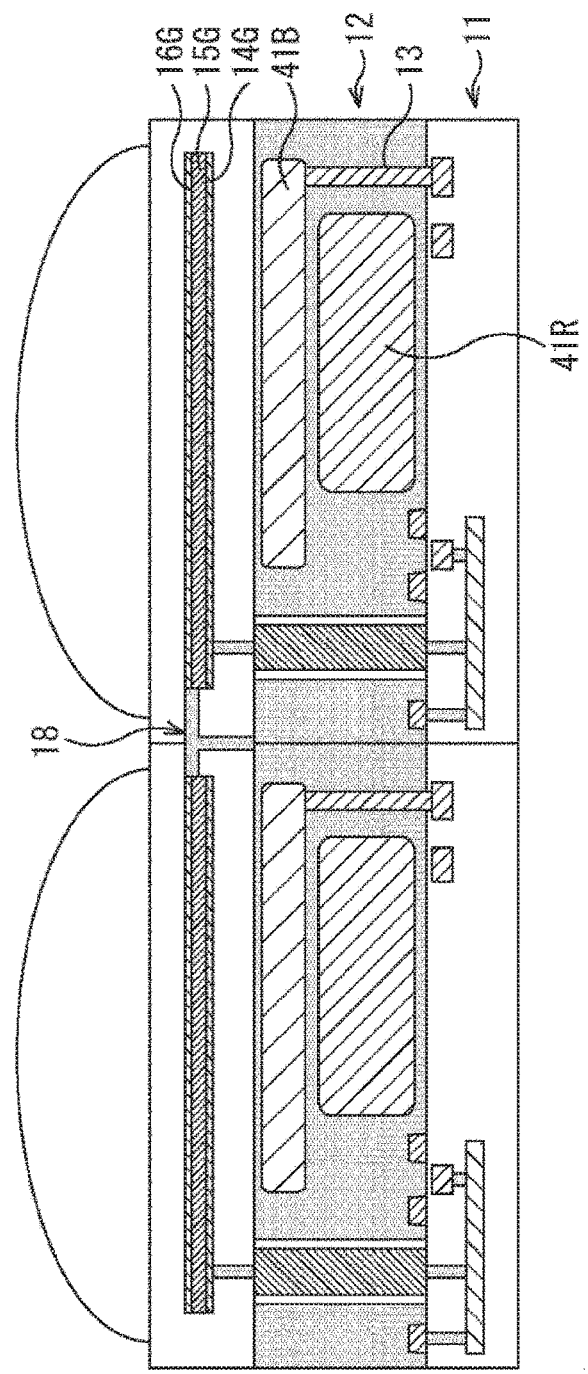
FIG. 10 is a cross-sectional view illustrating a modification 4 of the solid-state image sensor to which the present disclosure is applied.

FIG. 10 illustrates a still another example configuration (modification 4) of the solid-state image sensor 10 of the embodiment of the present disclosure.

In the modification 4, a photoelectric conversion layer 41R that generates an R-component signal depending on the R component of incident light and a photoelectric conversion layer 41B that generates a B-component signal depending on the B component of the incident light are provided inside of the Si layer 12, instead of the photoelectric conversion film 15R and the photoelectric conversion film 15B in the example configuration of FIG. 1.

As in the modifications 3 and 4, as a result of providing a photoelectric conversion layer in the inside of the Si layer 12, the lower electrode 14 provided on the lower side of the photoelectric conversion film 15 and the upper electrode 16 provided on the upper side thereof, which are replaced by the photoelectric conversion layer, can be omitted.

<Application of the Solid-state Image Sensor 10 of Present Embodiment>

While the solid-state image sensor 10 of the present embodiment is of a backside-illuminated type, the present disclosure is also applicable to a front-side-illuminated solid-state image sensor.

In addition, the present disclosure is applicable to either of three-transistor and four-transistor solid-state image sensors.

Figure 11:
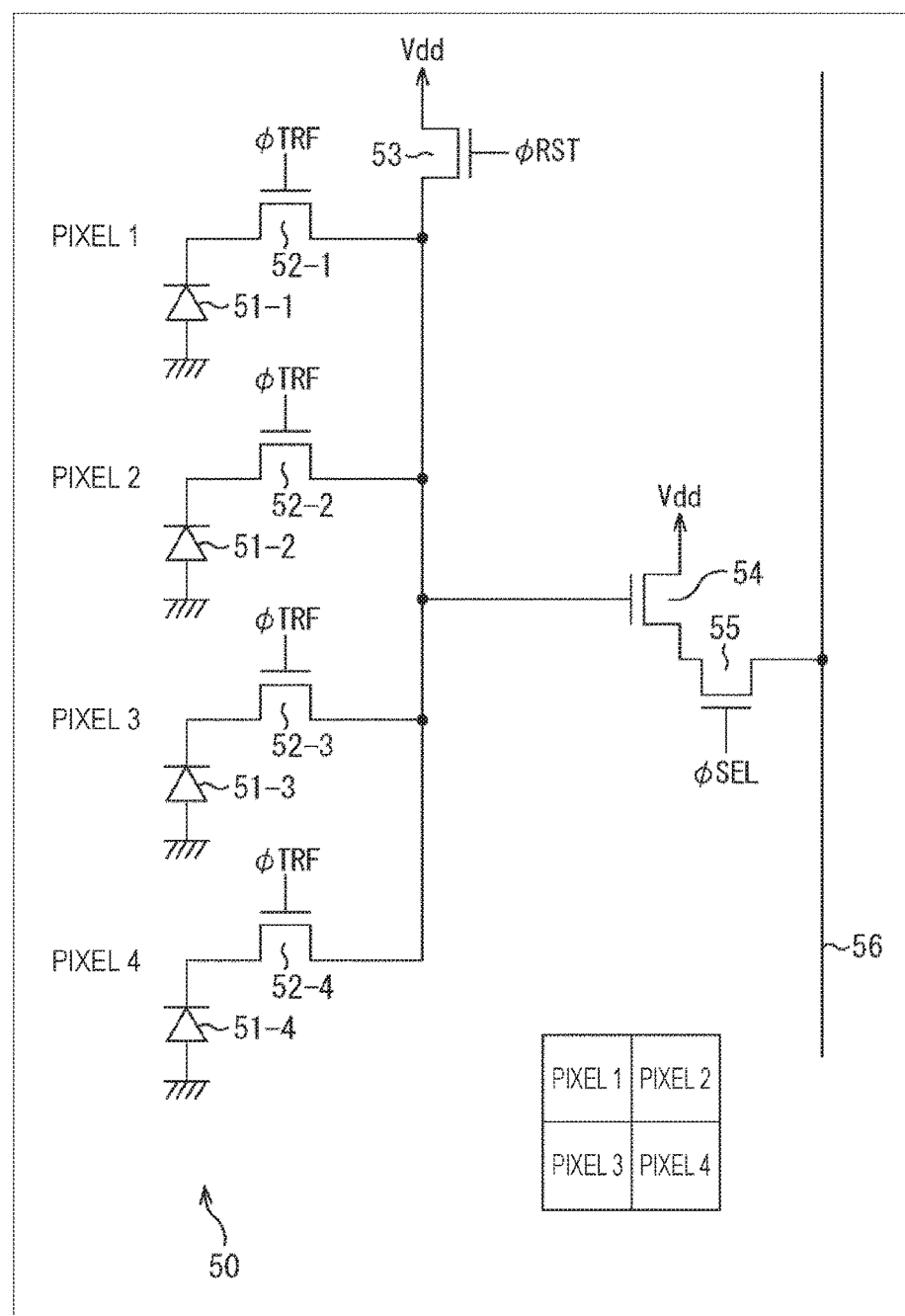
FIG. 11 is a circuit diagram illustrating an example configuration of a four-pixel shared CMOS image sensor.

Furthermore, the present disclosure is also applicable to a solid-state image sensor in which a plurality of pixels share an FD and the like as in a four-pixel shared CMOS image sensor 50 illustrated in FIG. 11, for example.

Figure 12:
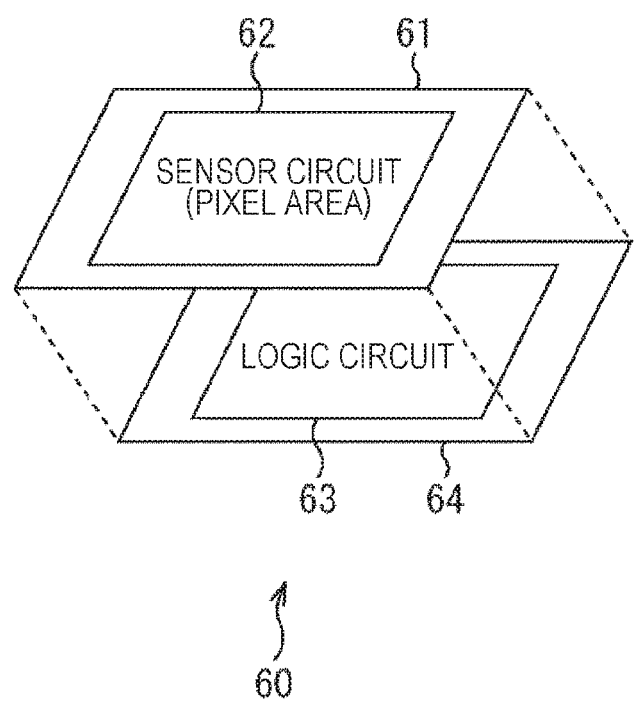
FIG. 12 is a block diagram illustrating an example configuration of a stacked CMOS image sensor.

Still further, the present disclosure is also applicable to a stacked CMOS image sensor 60 in which a substrate 61 on which a sensor circuit 62 is formed and a substrate 64 on which a logic circuit 63 is formed are stacked as illustrated in FIG. 12, for example.

Note that the solid-state image sensor 10 of the present embodiment is applicable to not only an imaging device but also to various types of electronic devices having imaging functions.

Embodiments of the present disclosure are not limited to the embodiment described above, but various modifications may be made thereto without departing from the scope of the present disclosure.

Note that the present disclosure can also have the following configurations.

(1)

A solid-state image sensor including a plurality of pixels arranged in a matrix, wherein each of the pixels includes:

a first photoelectric conversion part configured to perform photoelectric conversion on the basis of incident light of a first wavelength of three primary colors of light;

a second photoelectric conversion part configured to perform photoelectric conversion on the basis of incident light of a second wavelength of the three primary colors of light; and a third photoelectric conversion part configured to perform photoelectric conversion on the basis of incident light of a third wavelength of the three primary colors of light, the solid-state image sensor including an electrode wiring at a boundary of adjacent pixels, the electrode wiring horizontally connecting an electrode of at least one of the first to third photoelectric conversion parts in one of the adjacent pixels with an electrode of the corresponding one of the first to third photoelectric conversion parts in another of the adjacent pixels and vertically connecting with an electrode of at least one of the first to third photoelectric conversion parts of each of the pixels.

(2)

The solid-state image sensor described in (1), wherein at least one of the first to third photoelectric conversion parts includes a photoelectric conversion film, and a lower electrode and an upper electrode on respective sides of the photoelectric conversion film, and the electrode wiring horizontally connects the upper electrode of at least one of the first to third photoelectric conversion parts in one of the adjacent pixels with the upper electrode of the corresponding one of the first to third photoelectric conversion parts in another of the adjacent pixels.

(3)

The solid-state image sensor described in (2), wherein the electrode wiring horizontally connects the upper electrodes of the first to third photoelectric conversion parts in one of the adjacent pixels with the upper electrodes of the first to third photoelectric conversion parts in another of the adjacent pixels, respectively.

(4)

The solid-state image sensor described in (2) or (3), wherein the electrode wiring vertically connects the upper electrodes of the first to third photoelectric conversion parts in each of the pixels.

(5)

The solid-state image sensor described in any one of (1) to (4), wherein at least one of the first to third photoelectric conversion parts is a photoelectric conversion layer formed inside of a Si layer.

(6)

The solid-state image sensor described in any one of (1) to (5), further including a reflective film layer that reflects incident light at a lower side of the first to third photoelectric conversion parts.

(7)

The solid-state image sensor described in any one of (1) to (6), wherein the electrode wiring blocks light toward an Optical Black area.

(8)

The solid-state image sensor described in any one of (1) to (7), wherein the electrode wiring is made of a metal material.

(9)

The solid-state image sensor described in any one of (1) to (8), wherein the solid-state image sensor is of a backside-illuminated type.

(10)

The solid-state image sensor described in any one of (1) to (8), wherein the solid-state image sensor is of a front-side-illuminated type.

(11)

The solid-state image sensor described in any one of (1) to (10), wherein the solid-state image sensor is of a multiple-pixel-shared type.

(12)

The solid-state image sensor described in any one of (1) to (11), wherein the solid-state image sensor is of a stacked type.

(13)

An electronic device including a solid-state image sensor having a plurality of pixels arranged in a matrix, wherein each of the pixels includes:

a first photoelectric conversion part configured to perform photoelectric conversion on the basis of incident light of a first wavelength of three primary colors of light;

a second photoelectric conversion part configured to perform photoelectric conversion on the basis of incident light of a second wavelength of the three primary colors of light; and a third photoelectric conversion part configured to perform photoelectric conversion on the basis of incident light of a third wavelength of the three primary colors of light, the solid-state image sensor including an electrode wiring at a boundary of adjacent pixels, the electrode wiring horizontally connecting an electrode of at least one of the first to third photoelectric conversion parts in one of the adjacent pixels with an electrode of the corresponding one of the first to third photoelectric conversion parts in another of the adjacent pixels and vertically connecting with an electrode of at least one of the first to third photoelectric conversion parts of each of the pixels.

REFERENCE SIGNS LIST

10 Solid-state image sensor
11 Wiring layer
12 Si layer
13 Power supply
14 Lower electrode
15 Photoelectric conversion layer
16 Upper electrode
17 Lower electrode wiring 18 Upper electrode wiring
19 On-chip lens
21 Highly-reflective film layer
31, 41 Photoelectric conversion layer

What is claimed is:

1. A solid-state image sensor comprising:
a plurality of pixels arranged in a matrix, wherein each of the pixels includes:
a first photoelectric conversion part configured to perform photoelectric conversion on the basis of incident light of a first wavelength of three primary colors of light;
a second photoelectric conversion part configured to perform photoelectric conversion on the basis of incident light of a second wavelength of the three primary colors of light; and
a third photoelectric conversion part configured to perform photoelectric conversion on the basis of incident light of a third wavelength of the three primary colors of light; and an electrode wiring at a boundary of adjacent pixels of the pixels, the electrode wiring including a first portion, a second portion, and a third portion,
wherein the first portion horizontally connects a first electrode of a first one of the first to third photoelectric conversion parts in one of the adjacent pixels with a first electrode of a first corresponding one of the first to third photoelectric conversion parts in another of the adjacent pixels,
wherein the second portion extends vertically from the first portion at the boundary between the adjacent pixels to connect the first portion to the third portion,
wherein the third portion horizontally connects a second electrode of a second one of the first to third photoelectric conversion parts with a second electrode of a second corresponding one the first to third photoelectric conversion parts, and
wherein a first part of the first portion that contacts the first electrode and a second part of the first portion that contacts the first corresponding electrode are coplanar with a third part of the first portion that connects the first part of the first portion to the second part of the first portion.

2. The solid-state image sensor according to claim 1, wherein
the first to third photoelectric conversion parts each include a photoelectric conversion film, and a lower electrode and an upper electrode on respective sides of the photoelectric conversion film, and
the first electrode, the second electrode, the first corresponding electrode, and the second corresponding electrode are the upper electrodes of the first one and the second one of the first to third photoelectric conversion parts.

3. The solid-state image sensor according to claim 2, wherein a first part of the third portion that contacts the second electrode and a second part of the third portion that contacts the second corresponding electrode are coplanar with a third part of the third portion that connects the first part of the third portion to the second part of the third portion.

4. The solid-state image sensor according to claim 2, wherein, in the plan view, the electrode wiring forms a grid around the plurality of pixels.

5. The solid-state image sensor according to claim 2, wherein at least one of the first to third photoelectric conversion parts includes a photoelectric conversion layer formed inside of a Si layer.

6. The solid-state image sensor according to claim 2, further comprising a reflective film layer that reflects incident light at a lower side of the first to third photoelectric conversion parts.

7. The solid-state image sensor according to claim 2, wherein the electrode wiring blocks light toward an Optical Black area.

8. The solid-state image sensor according to claim 2, wherein the electrode wiring is made of a metal material.

9. The solid-state image sensor according to claim 2, wherein the solid-state image sensor is of a backside-illuminated type.

10. The solid-state image sensor according to claim 2, wherein the solid-state image sensor is of a front-side-illuminated type.

11. The solid-state image sensor according to claim 2, wherein the solid-state image sensor is of a multiple-pixel-shared type.

12. The solid-state image sensor according to claim 2, wherein the solid-state image sensor is of a stacked type.

13. The solid-state image sensor according to claim 2, further comprising:
a first lower electrode wiring connected to the lower electrode of the first photoelectric conversion part,
a second lower electrode wiring connected to the lower electrode of the second photoelectric conversion part, and
a third lower electrode wiring connected to the lower electrode of the third photoelectric conversion part,
wherein the first, second, and third lower electrode wirings are located at different corners of a corresponding one the pixels, respectively.

14. The solid-state image sensor according to claim 1, wherein the electrode wiring includes a fourth portion and a fifth portion,
wherein the fourth portion extends vertically from the third portion at the boundary between the adjacent pixels to connect the third portion to the fifth portion, and
wherein the fifth portion horizontally connects a third electrode of a third one of the first to third photoelectric conversion parts with a third electrode of a third corresponding one the first to third photoelectric conversion parts.

15. The solid-state image sensor according to claim 14, wherein the third portion and the fifth portion are wider than the first portion.

16. The solid-state image sensor according to claim 15, wherein the third portion and the fifth portion are the same width.

17. The solid-state image sensor according to claim 1, wherein the third portion is wider than the first portion.

18. An electronic device comprising:
a solid-state image sensor including:
a plurality of pixels arranged in a matrix, wherein each of the pixels includes:
a first photoelectric conversion part configured to perform photoelectric conversion on the basis of incident light of a first wavelength of three primary colors of light;
a second photoelectric conversion part configured to perform photoelectric conversion on the basis of incident light of a second wavelength of the three primary colors of light; and a third photoelectric conversion part configured to perform photoelectric conversion on the basis of incident light of a third wavelength of the three primary colors of light; and an electrode wiring at a boundary of adjacent pixels of the pixels, the electrode wiring including a first portion, a second portion, and a third portion, wherein the first portion horizontally connects a first electrode of a first one of the first to third photoelectric conversion parts in one of the adjacent pixels with a first electrode of a first corresponding one of the first to third photoelectric conversion parts in another of the adjacent pixels, wherein the second portion extends vertically from the first portion at the boundary between the adjacent pixels to connect the first portion to the third portion, wherein the third portion horizontally connects a second electrode of a second one of the first to third photoelectric conversion parts with a second electrode of a second corresponding one the first to third photoelectric conversion parts, and wherein a first part of the first portion that contacts the first electrode and a second part of the first portion that contacts the first corresponding electrode are coplanar with a third part of the first portion that connects the first part of the first portion to the second part of the first portion.

* * * * *